(12) United States Patent
Kim et al.

(10) Patent No.: US 9,370,128 B2
(45) Date of Patent: Jun. 14, 2016

(54) DISPLAY APPARATUS

(71) Applicant: SAMSUNG ELECTRONICS CO., LTD., Suwon-si (KR)

(72) Inventors: Jung Kyun Kim, Yongin-si (KR); Sung Ki Kim, Seoul (KR); Sru Kim, Anyang-si (KR); Jin Hyun Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 373 days.

(21) Appl. No.: 13/688,937

(22) Filed: Nov. 29, 2012

(65) Prior Publication Data

US 2014/0036448 A1 Feb. 6, 2014

(30) Foreign Application Priority Data

Aug. 3, 2012 (KR) .................. 10-2012-0085353

(51) Int. Cl.
*H05K 7/20* (2006.01)
*H04N 5/64* (2006.01)
*G06F 1/16* (2006.01)
*G06F 1/20* (2006.01)

(52) U.S. Cl.
CPC .......... *H05K 7/20963* (2013.01); *G06F 1/1601* (2013.01); *G06F 1/20* (2013.01); *H04N 5/64* (2013.01); *H05K 7/2099* (2013.01); *H05K 7/20954* (2013.01); *G06F 2200/1612* (2013.01)

(58) Field of Classification Search
CPC .................................................. H05K 7/2099
See application file for complete search history.

(56) References Cited

U.S. PATENT DOCUMENTS

| 4,304,376 | A | * | 12/1981 | Hilton | 244/123.6 |
|---|---|---|---|---|---|
| 4,880,052 | A | * | 11/1989 | Meyer et al. | 165/104.14 |
| 6,148,906 | A | * | 11/2000 | Li et al. | 165/104.33 |
| 6,880,626 | B2 | * | 4/2005 | Lindemuth et al. | 165/104.26 |
| 7,013,958 | B2 | * | 3/2006 | Garner et al. | 165/104.26 |
| 7,124,809 | B2 | * | 10/2006 | Rosenfeld et al. | 165/104.26 |
| 7,157,838 | B2 | * | 1/2007 | Thielemans et al. | 313/35 |
| 7,417,859 | B2 | * | 8/2008 | Bae et al. | 361/710 |
| 7,561,426 | B2 | * | 7/2009 | Jeong | 361/704 |

(Continued)

FOREIGN PATENT DOCUMENTS

| EP | 1 408 475 A1 | 4/2004 | |
|---|---|---|---|
| JP | 10207381 A | * 8/1998 | G09F 9/00 |

(Continued)

OTHER PUBLICATIONS

English machine translation of Japanese JP 11-251777 A, dated Sep. 1999, translated on Jan. 29, 2015.*

(Continued)

*Primary Examiner* — Robert J Hoffberg
(74) *Attorney, Agent, or Firm* — Sughrue Mion, PLLC

(57) ABSTRACT

A display apparatus and a method of spreading heat in the display apparatus are provided. The display apparatus includes: a display panel which display an image on a front surface thereof; an intermediate panel disposed on a rear surface, opposite the front surface, of the display panel; and a heat spreader disposed on the rear surface of the intermediate panel and which spreads heat, the heat spreader extending in a longitudinal direction from a first position of the rear surface of the intermediate panel in which the heat is present to a second position of the rear surface of the intermediate panel.

23 Claims, 5 Drawing Sheets

(56) References Cited

U.S. PATENT DOCUMENTS

| | | | |
|---|---|---|---|
| 7,751,190 B2 * | 7/2010 | Fujiwara | 361/700 |
| 7,762,707 B2 * | 7/2010 | Kim et al. | 362/632 |
| 7,995,342 B2 * | 8/2011 | Nakamichi et al. | 361/696 |
| 8,075,150 B2 * | 12/2011 | Maruyama | 362/97.1 |
| 8,142,042 B2 * | 3/2012 | Shibata et al. | 362/97.3 |
| 8,144,468 B2 * | 3/2012 | Nakamichi et al. | 361/701 |
| 8,256,501 B2 * | 9/2012 | Nagai | F28D 15/0233 165/104.21 |
| 8,274,789 B2 * | 9/2012 | Nakamichi et al. | 361/688 |
| 8,724,321 B2 * | 5/2014 | Nakamichi et al. | 361/696 |
| 8,746,912 B2 * | 6/2014 | Nakamichi et al. | 362/97.4 |
| 8,760,867 B2 * | 6/2014 | Nakamichi et al. | 361/696 |
| 8,811,014 B2 * | 8/2014 | Chauhan et al. | 361/700 |
| 8,971,037 B2 * | 3/2015 | Kang | 361/679.47 |
| 2008/0170400 A1 * | 7/2008 | Maruyama | 362/294 |
| 2009/0009974 A1 * | 1/2009 | Tseng et al. | 361/711 |
| 2011/0076389 A1 * | 3/2011 | Lee et al. | 427/66 |
| 2012/0145357 A1 * | 6/2012 | Moon | 165/104.26 |
| 2012/0160452 A1 * | 6/2012 | Kang | 165/104.13 |
| 2014/0008041 A1 * | 1/2014 | In et al. | 165/104.19 |

FOREIGN PATENT DOCUMENTS

| | | | | |
|---|---|---|---|---|
| JP | 11065459 A | * | 3/1999 | G09F 9/00 |
| JP | 11251777 A | * | 9/1999 | H05K 7/20 |
| JP | 11327449 A | * | 11/1999 | |
| JP | 2001282114 A | * | 10/2001 | G09F 9/00 |
| JP | 2006-172756 A | | 6/2006 | |
| JP | 2009128413 A | * | 6/2009 | G09F 9/00 |
| JP | 2009229900 A | * | 10/2009 | G02F 1/1333 |
| KR | 20040040569 A | * | 5/2004 | |
| KR | 20050023013 A | * | 3/2005 | |
| KR | 20050051154 A | * | 6/2005 | |
| KR | 20050099700 A | * | 10/2005 | |
| KR | 10-2011-0033587 A | | 3/2011 | |
| KR | 10-2011-0076246 A | | 7/2011 | |
| KR | 10-2011-0118293 A | | 10/2011 | |

OTHER PUBLICATIONS

English machine translation of Japanese JP 2001-282114 A, dated Oct. 2001, translated on Jan. 28, 2015.*

English machine translation of Japanese JP 2009-128413 A, dated Jun. 2009, translated on Jan. 29, 2015.*

English machine translation of Korean KR 1020050051154 A, dated Jun. 2005, No date.*

Communication dated Jun. 27, 2013 issued by the International Searching Authority in counterpart International Application No. PCT/KR2013/002154 (PCT/ISA/210).

* cited by examiner

DISPLAY APPARATUS

CROSS-REFERENCE TO RELATED APPLICATION

This application claims priority from Korean Patent Application No. 10-2012-0085353, filed on Aug. 3, 2012 in the Korean Intellectual Property Office, the disclosure of which is incorporated herein by reference in its entirety.

BACKGROUND

1. Field

Apparatuses and methods consistent with exemplary embodiments relate to a display apparatus which may efficiently dissipate heat generated by a printed circuit board.

2. Description of the Related Art

A display apparatus is a device that displays an image on a screen. Examples of the display apparatus include televisions (TVs) and computer monitors.

Recently, a flat panel display apparatus has been developed to replace cathode-ray tube (CRT) display devices, achieving slim design, light weight, and low power consumption.

Flat panel display devices may be broadly classified into a light-emitting type and a light-receiving type. Flat panel display devices of the light-emitting type include plasma display panels (PDPs) and organic light emitting diode (OLED) display panels. Flat panel display devices of the light-receiving type include liquid crystal displays (LCDs).

Among display devices, display devices employing OLEDs provide better luminance and wider viewing angle than LCDs and do not need a backlight unit, and thus they may enable a super slim design.

SUMMARY

One or more exemplary embodiments provide a display apparatus which may increase heat dissipation by more effectively distributing heat generated in operation of the apparatus.

Additional aspects will be set forth in part in the description which follows and, in part, will be obvious from the description, or may be learned from practice of exemplary embodiments.

According to an aspect of an exemplary embodiment, there is provided a display apparatus including: a display panel which displays an image on a front surface thereof; an intermediate panel on a rear surface, opposite the front surface, of the display panel; and a heat spreader on a rear surface of the intermediate panel and which spreads heat, the heat spreader extending in a longitudinal direction from a first position of the rear surface of the intermediate panel in which the heat is present to a second position of the rear surface of the intermediate panel.

The display panel may be an OLED panel.

The at least one heat spreader may include a working fluid injected therein and at least one channel inside the heat spreader to guide the working fluid.

The at least one channel may extend in the longitudinal direction and may include a plurality of channels arranged in parallel in a widthwise direction of the heat spreader.

A first end of the heat spreader may be at the first position and a second end, opposite the first end, of the heat spreader may be at the second position, the second position being a lower temperature area as compared to the first position.

The first position may be lower than the second position.

The display apparatus may further include at least one printed circuit board on the rear surface of the intermediate panel and a holder on which the at least one printed circuit board is provided, wherein the holder is at the first position of the rear surface of the intermediate panel, and the second position is spaced apart from the holder.

The first end of the heat spreader may be between the intermediate panel and the holder.

The display apparatus may further include a plurality of heat spreaders, including the heat spreader, which are spread apart from each other, extend in a first direction, and are arranged in parallel in a second direction perpendicular to the first direction, wherein the holder is disposed at a center area of the rear surface of the intermediate panel, wherein first ends of first heat spreaders, among the plurality of the heat spreaders, are at the holder and second ends, opposite the first ends, of the first heat spreaders are at a first side of the rear surface of the intermediate panel, and wherein first ends of second heat spreaders, different from the first heat spreaders among the plurality of the heat spreaders, are at the holder and second ends, opposite the first ends, of the second heat spreaders are at a second side, opposite the first side, of the rear surface of the intermediate panel.

Each of the plurality of the heat spreaders may be arranged in an inclined manner such that the second end thereof is at a higher position than the first end thereof.

The display apparatus may further include a circuit board on a rear side of an upper portion or a lower portion of the intermediate panel and extending in a horizontal direction, wherein the heat spreader is between the intermediate panel and the circuit board and extends in the horizontal direction.

The display apparatus may further include: a circuit board on a rear side of a lower portion of the intermediate panel and extending in a horizontal direction; and a plurality of heat spreaders, including the heat spreader, extending in a vertical direction and laterally spaced apart from each other, wherein a lower end of each of the plurality of the heat spreaders is between the intermediate panel and the circuit board.

According to an aspect of another exemplary embodiment, there is provided a display apparatus including: a display panel which displays an image on a front surface thereof; an intermediate panel on a rear surface, opposite the front surface, of the display panel to support the display panel; at least one printed circuit board on a rear side of the intermediate panel; a holder on which the at least one printed circuit board is provided; and a heat spreader on a rear surface of the intermediate panel, wherein a first end of the heat spreader is at the holder and a second end, opposite the first end, of the heat spreader is at a position spaced apart from the holder, in order to distribute heat generated by the at least one printed circuit board from the first end to the second end.

According to an aspect of another exemplary embodiment, there is provided a method of spreading heat in a display apparatus including a display panel, an intermediate panel, and a heat spreader, the method including: absorbing, by a first end of the heat spreader, the heat at a first position of a rear surface of the intermediate panel, the intermediate panel being on a rear surface of the display panel to support the display panel; an spreading, by the heat spreader, the heat from the first end to a second end of the heat spreader, wherein the heat spreader is on the rear surface of the intermediate panel and extends in a longitudinal direction from the first position to a second position of the rear surface of the intermediate panel.

BRIEF DESCRIPTION OF THE DRAWINGS

The above and/or other aspects will become apparent and more readily appreciated from the following description of exemplary embodiments, taken in conjunction with the accompanying drawings of which.

DETAILED DESCRIPTION OF EXEMPLARY EMBODIMENTS

Figure 1:
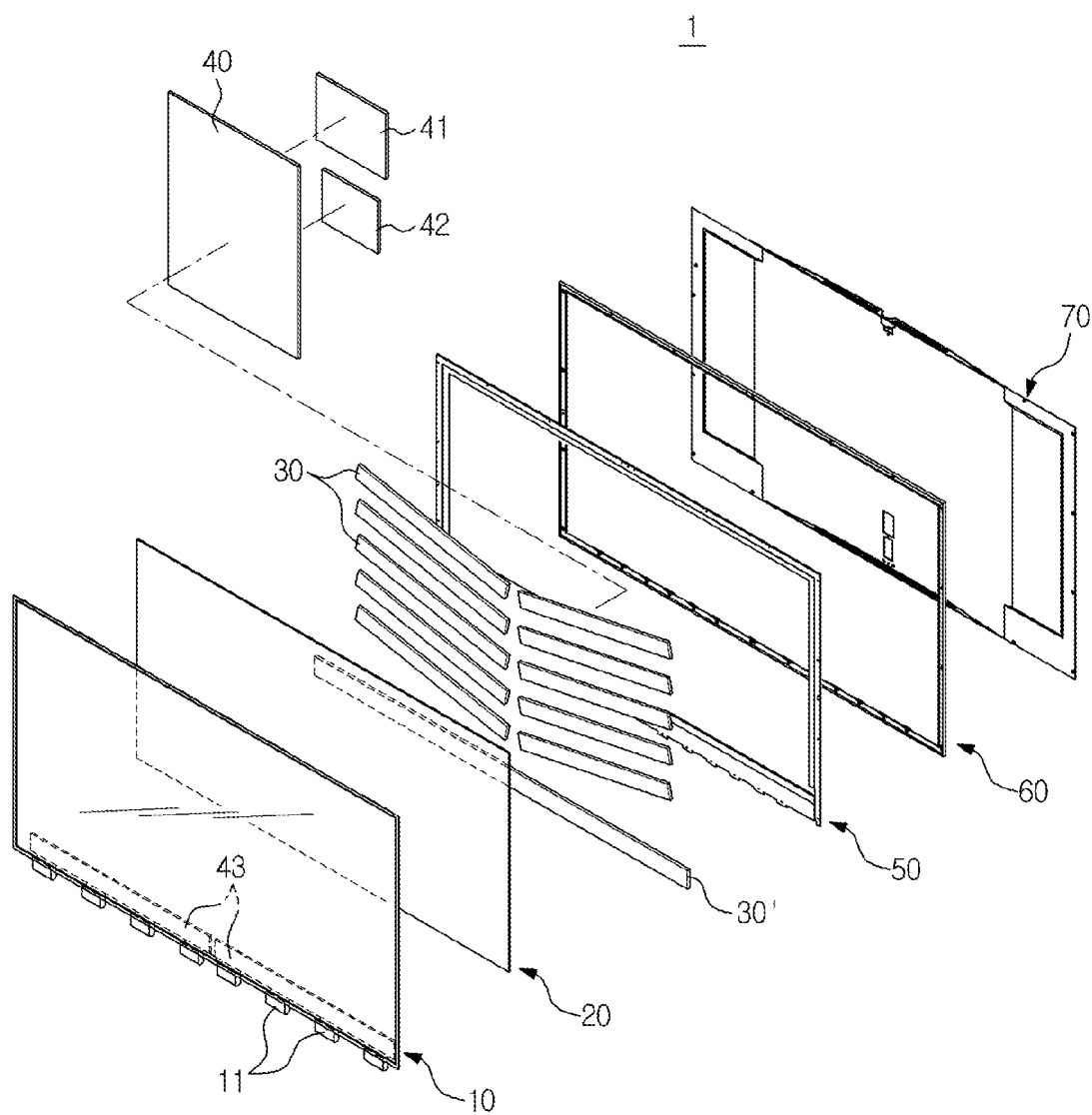
FIG. 1 is an exploded perspective view showing a configuration of a display apparatus according to an exemplary embodiment.

Reference will now be made in detail to exemplary embodiments, examples of which are illustrated in the accompanying drawings, wherein like reference numerals refer to like elements throughout.

FIG. 1 is an exploded perspective view showing a configuration of a display apparatus 1 according to an exemplary embodiment. As shown in FIG. 1, the display apparatus 1 includes a display panel 10 which is disposed to have an exposed front surface and on which an image is displayed, and a rear cover 70 disposed behind the display panel 10 to form a rear appearance of the display apparatus 1.

The display panel 10 is an organic light emitting diode (OLED) panel, and is divided into an active area, where images are displayed, and an inactive area, where images are not displayed.

The active area of the display panel 10 is provided with a plurality of thin film transistors formed on a glass substrate, and each of the thin film transistors is provided thereon with a liquid crystal layer or an organic layer to form a pixel. Images are displayed on the active area through on/off control of the thin film transistors.

An intermediate panel 20 to support the rear surface of the display panel 10 is arranged between the display panel 10 and the rear cover 70.

The intermediate panel 20 is formed by arranging a honeycomb structure between two aluminum sheets to have a light weight and a high strength. The intermediate panel 20 is pressed against the rear surface of the display panel 10 by a bracket 50, which will be described below.

Printed circuit boards 41, 42, and 43 are arranged on the rear side of the intermediate panel 20. The printed circuit boards 41, 42, and 43 include a main board 41 to generate an image signal to be transmitted to the display panel 10, a power supply board 42 to connect an external power source to the display apparatus 1, and a source board 43 to transmit the image signal generated by the main board 41 to the display panel 10 through a flexible printed circuit board 11. In the present exemplary embodiment, among the printed circuit boards 41, 42, and 43, the main board 41 and the power source board 42 are disposed at the center of the rear side of the intermediate panel 20 through a holder 40, to which the main board 41 and the power source board 42 are mounted, and the source board 43 is disposed on the rear side of the lower portion of the intermediate panel 20 to extend in a horizontal direction.

In addition, a plurality of heat spreaders 30 is arranged to allow heat generated by the printed circuit boards 41, 42, and 43 to be distributed more rapidly and dissipated more efficiently.

Figure 2:
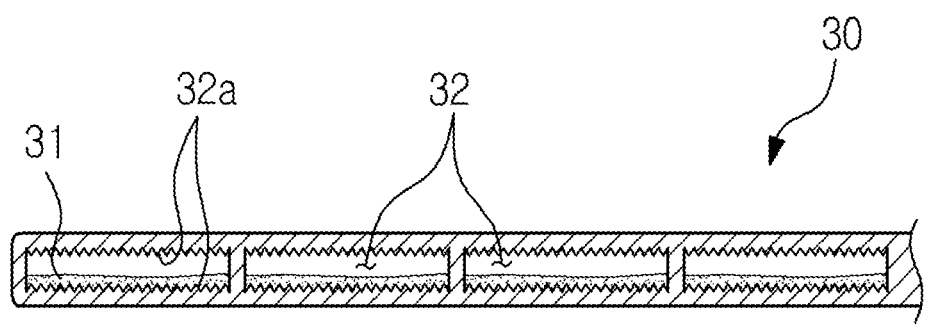
FIG. 2 is a cross-sectional view illustrating a heat spreader applied to a display apparatus according to an exemplary embodiment.

A heat spreader 30, among the plurality of heat spreaders 30, has a shape of a plate longitudinally extending with a width kept constant or substantially constant (although it is understood that one or more other exemplary embodiments are not limited thereto), and is provided therein with at least one channel 32 adapted to guide movement of a working fluid 31 injected into the heat spreader 30, as shown in FIG. 2. The at least one channel 32 extends in the longitudinal direction of the heat spreader 30, and a plurality of the channels 32 is arranged in parallel in the widthwise direction of the heat spreader 30. Also, a plurality of protrusions 32a extending in the longitudinal direction of the heat spreader 30 is provided on the wall of each channel 32 to facilitate movement of the working fluid 31. In addition, the heat spreader 30 may be formed of an aluminum material, and acetone may be used as the working fluid 31 since acetone does not easily oxidize aluminum when changing from liquid phase to gas phase.

A first end of the heat spreader 30 is placed at a position which is at a relatively higher temperature and a second end thereof positioned opposite the first end is placed at a position which is at a relatively lower temperature. Thereby, heat is absorbed through the first end installed at the position of the higher temperature and guided to the second end placed at the position of the lower temperature to be dissipated. In addition, the position of the second end may be higher than the position of the first end to allow the working fluid 31 to circulate more rapidly in the channel 32 of the heat spreader 30.

Figure 3:
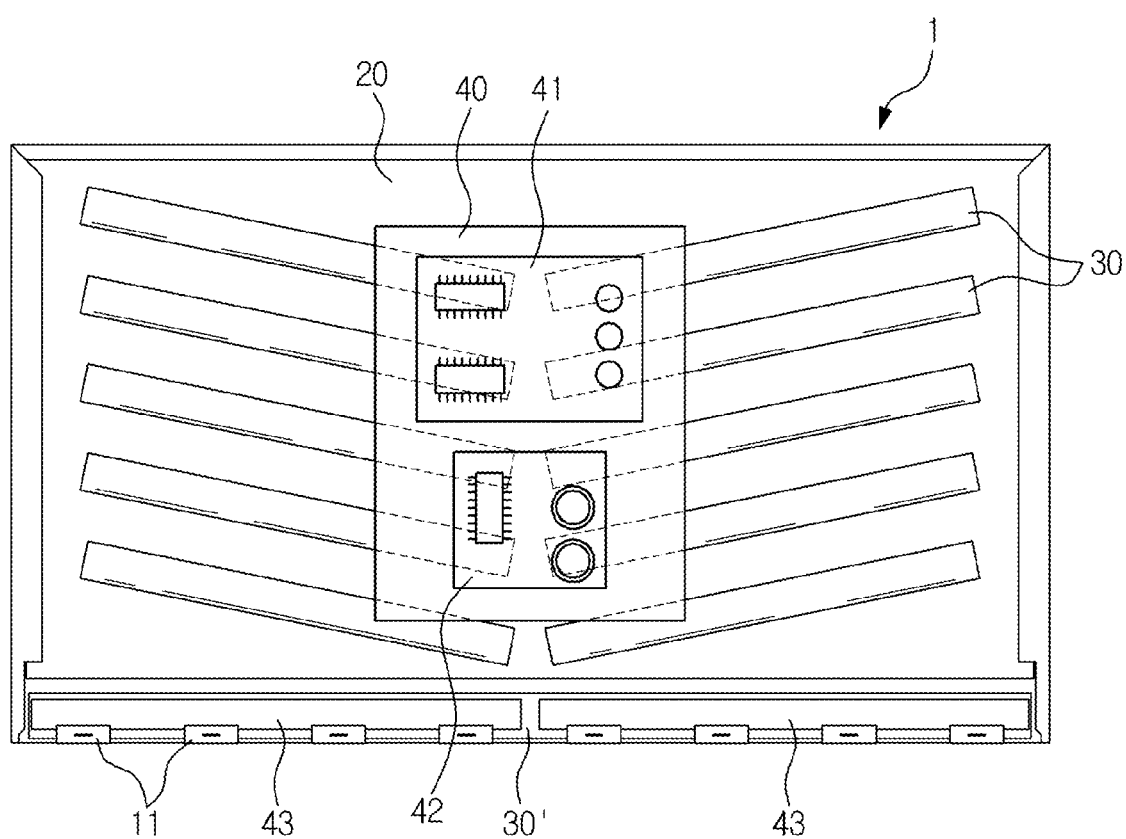
FIG. 3 is a rear view illustrating installation of heat spreaders applied to a display apparatus according to an exemplary embodiment.

A plurality of heat spreaders 30 may be arranged on the rear surface of the intermediate panel 20 to distribute heat generated by the printed circuit boards 41, 42, and 43 disposed at the rear surface of the intermediate panel 20, as shown in FIG. 3.

As described above, among the printed circuit boards 41, 42, and 43, the main board 41 and the power source board 42 are installed (i.e., located) at the center of the rear surface of the intermediate panel 20 through the holder 40, and thus the heat spreaders 30 are disposed at the rear surface of the intermediate panel 20 to extend in the horizontal direction and be spaced from each other in a vertical direction.

The first ends of some of the plurality of the heat spreaders 30 are placed close to the center of the rear surface of the intermediate panel 20 where the holder 40 is disposed, and the second ends thereof are placed on a first side (e.g., the right side) of the rear surface of the intermediate panel 20. The first ends of the rest of the plurality of heat spreaders 30 are placed close to the center of the rear surface of the intermediate panel 20 where the holder 40 is disposed, and the second ends thereof are placed on a second side (e.g., the left side) of the rear surface of the intermediate panel 20. Accordingly, the heat generated by the main board 41 and the power source board 42 is transmitted to the holder 40 and distributed through the heat spreaders 30 from the center of the intermediate panel 20 to the opposite sides of the intermediate panel 20. In the present exemplary embodiment, the first ends of the heat spreaders 30 are placed between the intermediate panel 20 and the holder 40. Further, each of the heat spreaders 30 are arranged in an inclined manner to place the second end thereof, which is spaced apart from the holder 40, at a higher position than the first end thereof positioned at the holder 40, thereby allowing the working fluid 31 to circulate rapidly.

When the heat spreaders 30 are installed as above, the working fluid 31 which is in a liquid phase in the first ends absorbs heat from the holder 40 and is vaporized. The vaporized working fluid 31 is moved along the plurality of channels 32 to the second ends by the density difference. While moved to the second ends and after reaching the second ends, the working fluid 31 in the gas phase loses heat and condenses to return to the first ends at lower positions by a weight thereof. Thereby, the working fluid 31 is allowed to circulate rapidly, and thus the distribution of heat by the heat spreaders 30 is rapidly implemented.

Further, among the heat spreaders 30, a heat spreader 30' is used to distribute heat generated by the source board 43 disposed at a lower portion of the intermediate panel 20. As described above, the source board 43 is disposed at the rear side of the lower portion of the intermediate panel 20 to extend in the horizontal direction, and thus the heat spreader 30' is also disposed to extend in the horizontal direction and arranged between the intermediate panel 20 and the source board 43 to allow the heat generated by the source board 43 to be distributed.

Figure 4:
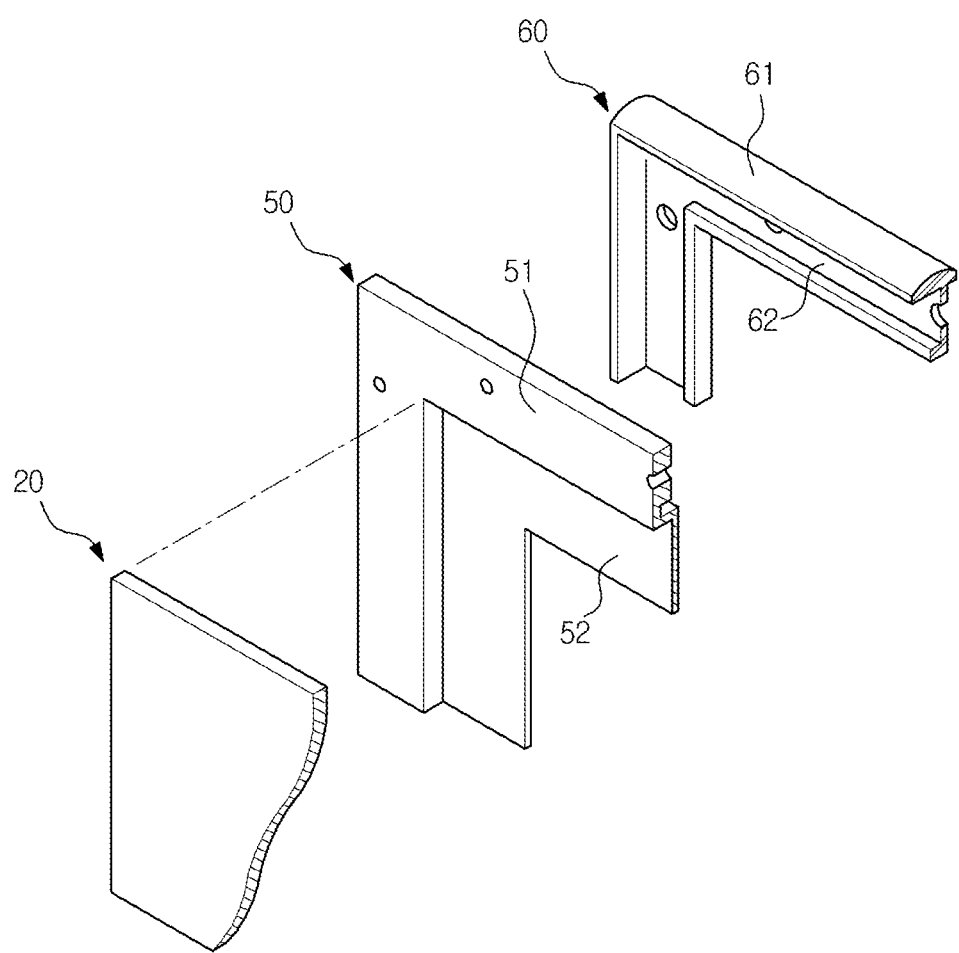
FIG. 4 is a partially enlarged perspective view illustrating installation of heat spreaders applied to a display apparatus according to an exemplary embodiment.

Arranged between the display panel 10 and the rear cover 70 is a bracket 50 that presses the front surface of the intermediate panel 20 against the rear surface of the display panel 10, as shown in FIG. 1. The bracket 50 is attached to the display panel 10 and the intermediate panel 20 by an adhesive material such as double-sided tape or any other type of adhesive. As shown in FIG. 4, the bracket 50 includes a first combining portion 51 to be attached to the display panel 10 and a second combining portion 52 to be attached to the intermediate panel 20.

The first combining portion 51 is attached to the display panel 10 at the portions of the display panel 10 beyond the outer edge of the intermediate panel 20 to reinforce the edge of the display panel 10. In addition, the first combining portion 51 is arranged to match the edge of the display panel 10 or protrude beyond the edge of the display panel 10 to protect the edge of the display panel 10.

The second combining portion 52, which is disposed between the intermediate panel 20 and the rear cover 70, is attached to the rear surface of an intermediate panel 20, and presses the intermediate panel 20 against the display panel 10 to cause the intermediate panel 20 to closely contact the display panel 10, and thereby allowing the intermediate panel 20 to stably support the display panel 10.

Further, the display apparatus 1 includes a side cover 60 forming the outer edge of the display apparatus 1. The side cover 60 includes an edge 61 disposed outside the edges of all components from the display panel 10 to the rear cover 70 to form the outer appearance of the display apparatus 1, and a support 62 extending inward from the edge 61 to support the rear surface of the bracket 50.

Figure 5:
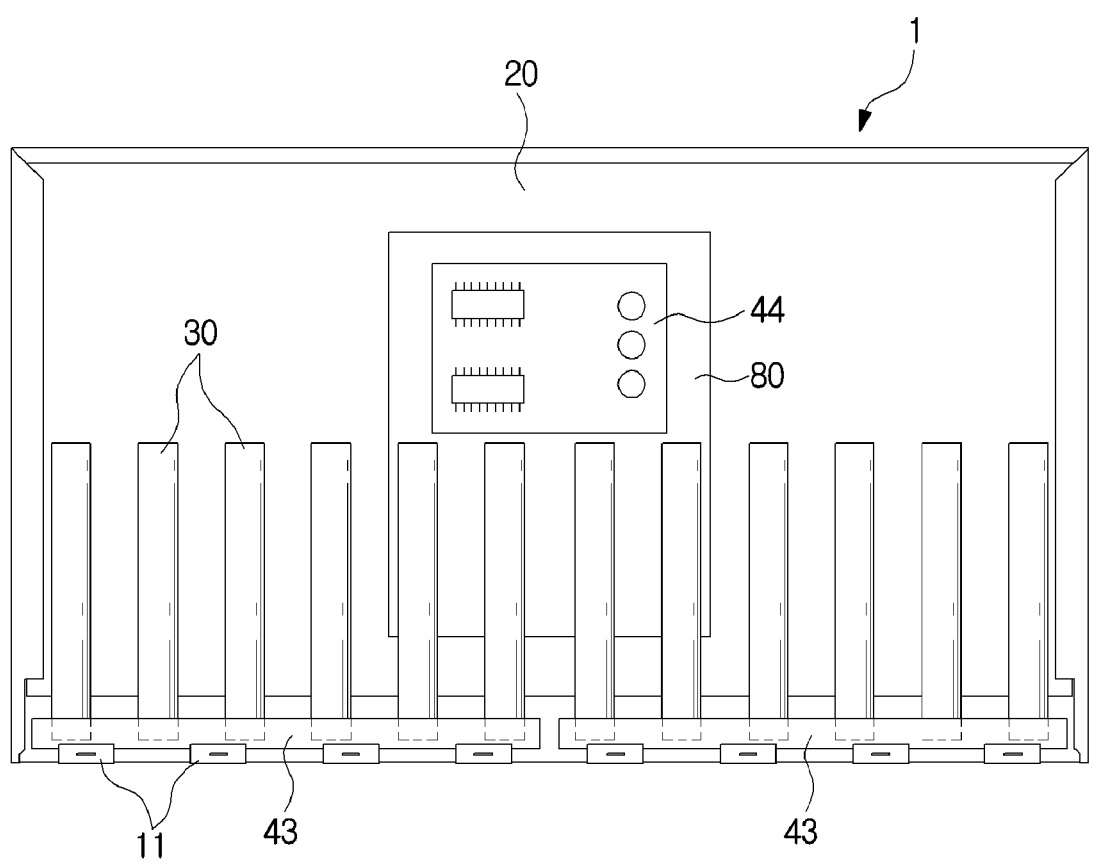
FIG. 5 is a rear view illustrating installation of heat spreaders applied to a display apparatus according to another exemplary embodiment.

In the present exemplary embodiment, the heat spreaders 30 to distribute heat generated by the source board 43 are arranged to extend in the horizontal direction, although it is understood that one or more other exemplary embodiments are not limited thereto. As shown in FIG. 5, a plurality of the heat spreaders 30 extending in the vertical direction may be arranged in parallel to be spaced from each other in the horizontal direction, and the first ends formed by the lower ends of the heat spreaders 30 may be placed between the intermediate panel 20 and the source board 43 to distribute heat generated by the source board 43. In this case, a signal transmission board 44 to transmit signals is arranged at the center of the rear surface of the intermediate panel 20 through the heat dissipation sheet 80.

In the present exemplary embodiment, the source board 43 is disposed at the rear side of a lower portion of the intermediate panel 20, although it is understood that one or more other exemplary embodiments are not limited thereto. Depending on display apparatuses, the source board 43 may be disposed on the rear side of an upper portion of the intermediate panel 20. When the source board 43 is disposed in this way, the heat spreaders 30 may still be installed (i.e., located) in the same way as described above to allow the heat generated by the source board 43 to be distributed through the heat spreaders 30.

A method of spreading heat, according to another exemplary embodiment, in a display apparatus including a display panel, an intermediate panel, and a heat spreader, includes: absorbing, by a first end of the heat spreader, the heat at a first position of a rear surface of the intermediate panel, the intermediate panel being on a rear surface of the display panel to support the display panel; an spreading, by the heat spreader, the heat from the first end to a second end of the heat spreader. In the present exemplary embodiment, the heat spreader is on the rear surface of the intermediate panel and extends in a longitudinal direction from the first position to a second position of the rear surface of the intermediate panel.

As is apparent from the above description, since heat generated by printed circuit boards is distributed through heat spreaders, a display apparatus according to exemplary embodiments may allow the heat generated by the printed circuit boards to be more rapidly dissipated.

Although a few exemplary embodiments have been shown and described, it would be appreciated by those skilled in the art that changes may be made in these exemplary embodiments without departing from the principles and spirit of the present inventive concept, the scope of which is defined in the claims and their equivalents.

What is claimed is:

1. A display apparatus comprising:
 a display panel which displays an image on a front surface thereof;
 an intermediate panel which is disposed on a rear surface, opposite the front surface, of the display panel and covers an entire rear surface of the display panel;
 a holder disposed at a center area and not adjacent to any peripheral area of a rear surface of the intermediate panel, the holder being adjacent to a heat generating part of the display apparatus and to which heat from the heat generating part is transmitted; and
 a heat spreader which is disposed on the rear surface of the intermediate panel and spreads heat, the heat spreader extending in a longitudinal direction from a first end of the heat spreader positioned at the holder to a second end of the heat spreader, which is opposite to the first end and spaced apart from the holder,
 wherein the first end of the heat spreader is at a first position to which the heat from the holder is transmitted and the second end of the heat spreader is at a second position releasing the heat, the second position being a lower temperature area as compared to the first position.

2. The display apparatus according to claim 1, wherein the heat spreader has a shape of a plate extending in the longitudinal direction with a constant width.

3. The display apparatus according to claim 1, wherein the display panel is an organic light emitting diode panel.

4. The display apparatus according to claim 1, wherein the heat spreader comprises a working fluid therein and at least one channel inside the heat spreader to guide the working fluid.

5. The display apparatus according to claim 4, wherein the at least one channel extends in the longitudinal direction and includes a plurality of channels arranged in parallel in a widthwise direction of the heat spreader.

6. The display apparatus according to claim 5, wherein each of the plurality of channels is isolated from a neighboring channel of the plurality of channels by the heat spreader.

7. The display apparatus according to claim 4, wherein the heat spreader comprises aluminum, and the working fluid comprises acetone.

8. The display apparatus according to claim 4, wherein a plurality of protrusions extending in the longitudinal direction of the heat spreader is provided on a wall of the at least one channel.

9. The display apparatus according to claim 1, wherein the first position is lower than the second position.

10. The display apparatus according to claim 1, further comprising:
at least one printed circuit board which is the heat generating part and is disposed on the holder positioned at the rear surface of the intermediate panel,
wherein the holder is at the first position of the rear surface of the intermediate panel, and the second position is spaced apart from the holder.

11. The display apparatus according to claim 10, wherein the first end of the heat spreader is between the intermediate panel and the holder.

12. The display apparatus according to claim 10, further comprising:
a plurality of heat spreaders, including the heat spreader, which are spread apart from each other, extend in a first direction, and are arranged in parallel in a second direction perpendicular to the first direction,
wherein first ends of first heat spreaders among the plurality of the heat spreaders, including the first end of the heat spreader, are at the holder, and second ends, opposite the first ends, of the first heat spreaders, including the second end of the heat spreader, are at a first side of the rear surface of the intermediate panel, and
wherein first ends of second heat spreaders, different from the first heat spreaders among the plurality of the heat spreaders, are at the holder, and second ends, opposite the first ends of the second heat spreaders, of the second heat spreaders are at a second side, opposite the first side, of the rear surface of the intermediate panel.

13. The display apparatus according to claim 12, wherein each of the plurality of the heat spreaders is arranged in an inclined manner such that each of the second ends of the first heat spreaders is at a higher position than a corresponding first end among the first ends of the first heat spreaders, and each of the second ends of the second heat spreaders is at a higher position than a corresponding first end among the first ends of the second heat spreaders.

14. The display apparatus according to claim 1, further comprising:
a circuit board on a rear side of an upper portion or a lower portion of the intermediate panel and extending in a horizontal direction; and
another heat spreader disposed between the intermediate panel and the circuit board and extending in the horizontal direction.

15. The display apparatus according to claim 1, wherein the heat spreader comprises a working fluid therein and at least one channel provided inside the heat spreader to guide the working fluid having a liquid phase from the first end to the second end and to guide the working fluid, which vaporizes and releases in the second end, from the second end to the first end.

16. The display apparatus according to claim 1, wherein the intermediate panel is formed by arranging a honeycomb structure between two metal sheets.

17. The display apparatus according to claim 1, wherein the first end is not positioned on an edge of the rear surface of the intermediate panel.

18. A display apparatus comprising:
a display panel which displays an image on a front surface thereof;
an intermediate panel which is disposed on a rear surface, opposite the front surface, of the display panel and covers an entire rear surface of the display panel;
at least one printed circuit board on a rear surface of the intermediate panel, opposite the front surface of the display panel;
a holder which is disposed at a center area and not adjacent to any peripheral area of the rear surface of the intermediate panel and on which the at least one circuit board is provided; and
a heat spreader disposed on the rear surface of the intermediate panel,
wherein a first end of the heat spreader is at the holder and a second end, opposite the first end, of the heat spreader is at a position spaced apart from the holder, in order to distribute heat generated by the at least one printed circuit board from the first end to the second end, and
wherein the heat spreader extends in a longitudinal direction from the first end of the heat spreader to the second end of the heat spreader.

19. The display apparatus according to claim 18, further comprising a plurality of heat spreaders, including the heat spreader, the plurality of heat spreaders extending in a horizontal direction and arranged in parallel in a vertical direction to be spaced from each other.

20. The display apparatus according to claim 19, wherein:
first ends of first heat spreaders among the plurality of the heat spreaders, including the first end of the heat spreader, are at the holder, and second ends, opposite the first ends of the first heat spreaders, of the first heat spreaders, including the second end of the heat spreader, are on a right side of the rear surface of the intermediate panel; and
first ends of second heat spreaders, different from the first heat spreaders among the plurality of heat spreaders, are at the holder, and second ends, opposite the first ends of the second heat spreaders, of the second heat spreaders are on a left side of the rear surface of the intermediate panel.

21. The display apparatus according to claim 20, wherein each of the plurality of the heat spreaders is arranged in an inclined manner such that each of the second ends of the first heat spreaders is at a higher position than a corresponding first end among the first ends of the first heat spreaders, and each of the second ends of the second heat spreaders is at a higher position than a corresponding first end among the first ends of the second heat spreaders.

22. A method of spreading heat in a display apparatus comprising a display panel, an intermediate panel, a holder disposed at a center area and not adjacent to any peripheral area of a rear surface of the intermediate panel, and a heat spreader, the method comprising:
absorbing, by a first end of the heat spreader which is disposed at the holder, the heat at a first position of the rear surface of the intermediate panel, the intermediate panel being on a rear surface of the display panel and covers an entire rear surface of the display panel; and
spreading, by the heat spreader, the heat from the first end to a second end of the heat spreader, the second end being spaced apart from the holder, wherein the heat spreader is on the rear surface of the intermediate panel and extends in a longitudinal direction from the first position to a second position of the rear surface of the intermediate panel.

23. The method according to claim 22, wherein the heat spreader has a shape of a plate extending in the longitudinal direction with a constant width.

\* \* \* \* \*